United States Patent
Kim et al.

(10) Patent No.: US 9,761,288 B2
(45) Date of Patent: Sep. 12, 2017

(54) MEMORY CIRCUIT AND STACK TYPE MEMORY SYSTEM INCLUDING THE SAME

(71) Applicant: SK hynix Inc., Icheon-si, Gyeonggi-do (KR)

(72) Inventors: Min Chang Kim, Icheon-si (KR); Chang Hyun Kim, Icheon-si (KR); Do Yun Lee, Icheon-si (KR); Jae Jin Lee, Icheon-si (KR); Hun Sam Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/096,578

(22) Filed: Apr. 12, 2016

(65) Prior Publication Data

US 2017/0186469 A1    Jun. 29, 2017

(30) Foreign Application Priority Data

Dec. 28, 2015  (KR) .................. 10-2015-0187630

(51) Int. Cl.
*G11C 7/12* (2006.01)
*G11C 7/14* (2006.01)
*G11C 7/10* (2006.01)

(52) U.S. Cl.
CPC .............. *G11C 7/12* (2013.01); *G11C 7/1039* (2013.01); *G11C 7/14* (2013.01)

(58) Field of Classification Search
CPC ............ G11C 7/12; G11C 7/14; G11C 7/1039
See application file for complete search history.

(56) References Cited

U.S. PATENT DOCUMENTS

| | | | |
|---|---|---|---|
| 8,068,357 B2 * | 11/2011 | Ware ...................... | G11C 5/063 365/189.03 |
| 8,780,647 B2 * | 7/2014 | Ishikawa ............ | G01R 31/2884 365/189.011 |
| 9,251,877 B2 | 2/2016 | Lee | |
| 9,279,855 B2 | 3/2016 | Lee | |
| 2015/0043291 A1 * | 2/2015 | Kim ..................... | G11C 29/022 365/201 |

* cited by examiner

*Primary Examiner* — Tri Hoang
(74) *Attorney, Agent, or Firm* — William Park & Associates Ltd.

(57) ABSTRACT

A memory circuit may be provided. The memory circuit may include a memory array. The memory circuit may include an input and output path circuit coupled to a probe pad and a bump pad, and may be configured to input and output a signal between an exterior of the memory circuit and the memory array. The memory circuit may include a scanning circuit configured to generate a sensing signal by sensing a signal outputted through the bump pad while performing scanning of at least one of a reference voltage and a test strobe signal.

21 Claims, 6 Drawing Sheets

FIG.5
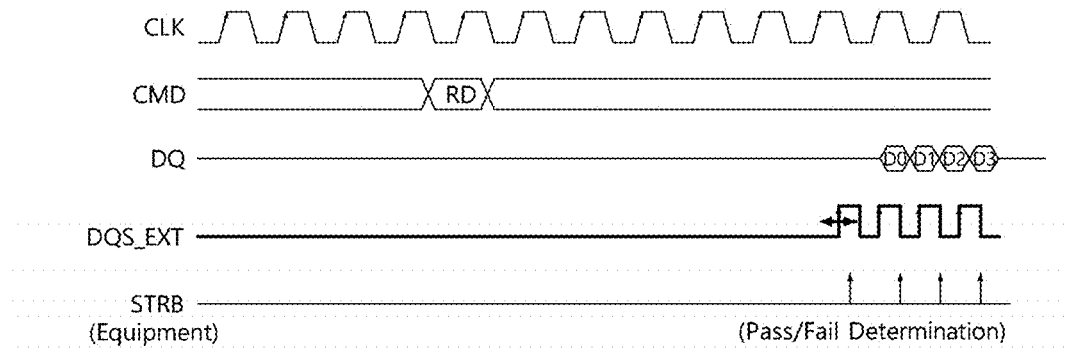
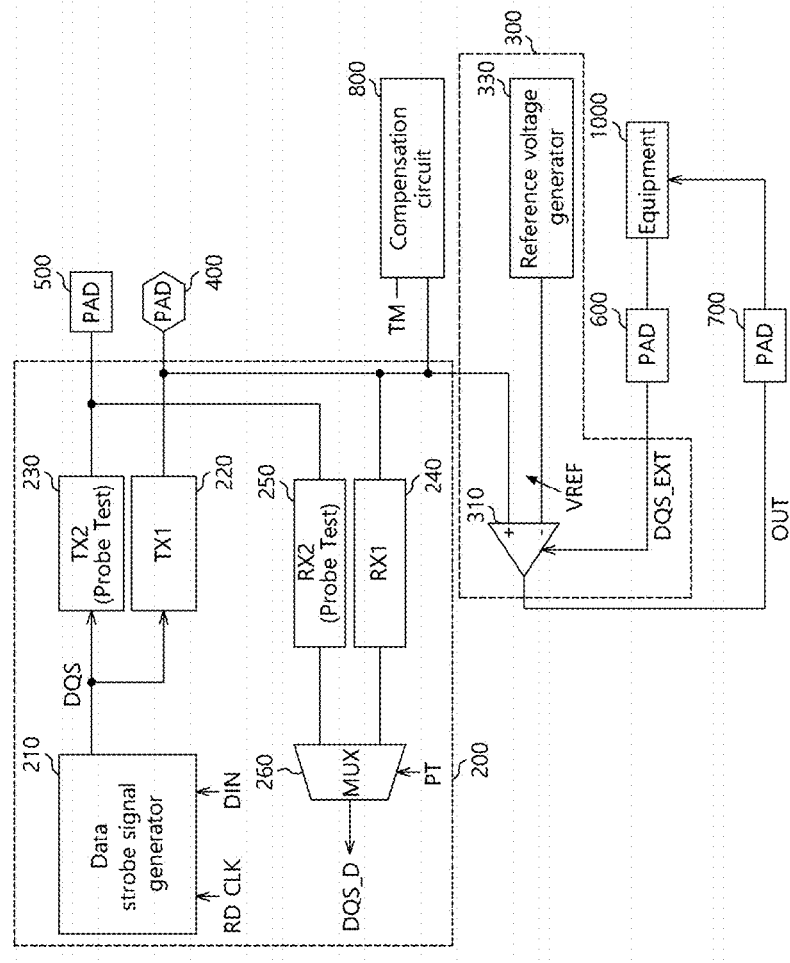
FIG.6

MEMORY CIRCUIT AND STACK TYPE MEMORY SYSTEM INCLUDING THE SAME

CROSS-REFERENCES TO RELATED APPLICATION

The present application claims priority under 35 U.S.C. §119(a) to Korean application number 10-2015-0187630, filed on Dec. 28, 2015, in the Korean Intellectual Property Office, which is incorporated herein by reference in its entirety.

BACKGROUND

1. Technical Field

Various embodiments generally relate to a semiconductor circuit, and, more particularly, to a memory circuit and a stack type memory system including the same.

2. Related Art

Semiconductor memory technology is being developed to provide a memory apparatus capable of implementing high bandwidths. Memory systems may have structures implementing a memory controller chip with a plurality of memory chips. The structures may be stacked and may include through electrodes, for example, TSVs (through-silicon vias).

However, since the memory system having the stack structure has a physical limit, that is, since an input/output-related component, for example, a bump pad, which is coupled with a through electrode and is used for input/output of a signal during a normal operation such as read/write, is too small in size to perform probing from an exterior, a problem is likely to be caused in that it is difficult to directly test the corresponding input/output-related component.

SUMMARY

In an embodiment, a memory circuit may be provided. The memory circuit may include a memory array. The memory circuit may include an input and output path circuit coupled with a probe pad and a bump pad, and may be configured to input and output a signal between an exterior of the memory circuit and the memory array. The memory circuit may include a scanning circuit configured to generate a sensing signal by sensing a signal outputted through the bump pad while performing scanning of at least one of a reference voltage and a test strobe signal.

In an embodiment, a stack type memory system may be provided. The stack type memory system may include a plurality of memory chips stacked over a memory controller chip. Through vias may be formed in each of the plurality of memory chips. Through vias of different memory chips may be coupled through bump pads. The memory system may include probe pads which are exposed to an outside, the probe pads configured for testing. At least one of the plurality of memory chips may be configured to generate a sensing signal by sensing a signal transmitted to the bump pad according to a read command while performing scanning of at least one of a reference voltage and a test strobe signal.

In an embodiment, a package may be provided. The package may include a memory array. The package may include an input and output path circuit coupled to a probe pad exposed to an outside of the package and a bump pad disposed within the package, and may be configured to input and output a signal between an exterior of the memory circuit and the memory array. The package may include a scanning circuit configured to generate a sensing signal by sensing a signal outputted through the bump pad and perform scanning of at least one of a reference voltage and a test strobe signal.

BRIEF DESCRIPTION OF THE DRAWINGS

FIG. 5 is a representation of an example of a timing diagram to assist in the explanation of a method for testing the memory circuit in accordance with an embodiment.

FIG. 6 is a diagram illustrating a representation of an example of the configuration of a memory circuit 101 in accordance with an embodiment.

DETAILED DESCRIPTION

Various embodiments may be directed to a memory circuit capable of enhancing test reliability of an input/output-related component, and a stack type memory system including the same.

Hereinafter, a memory circuit and a stack type memory system including the same may be described below with reference to the accompanying drawings through various examples of embodiments.

Figure 1:
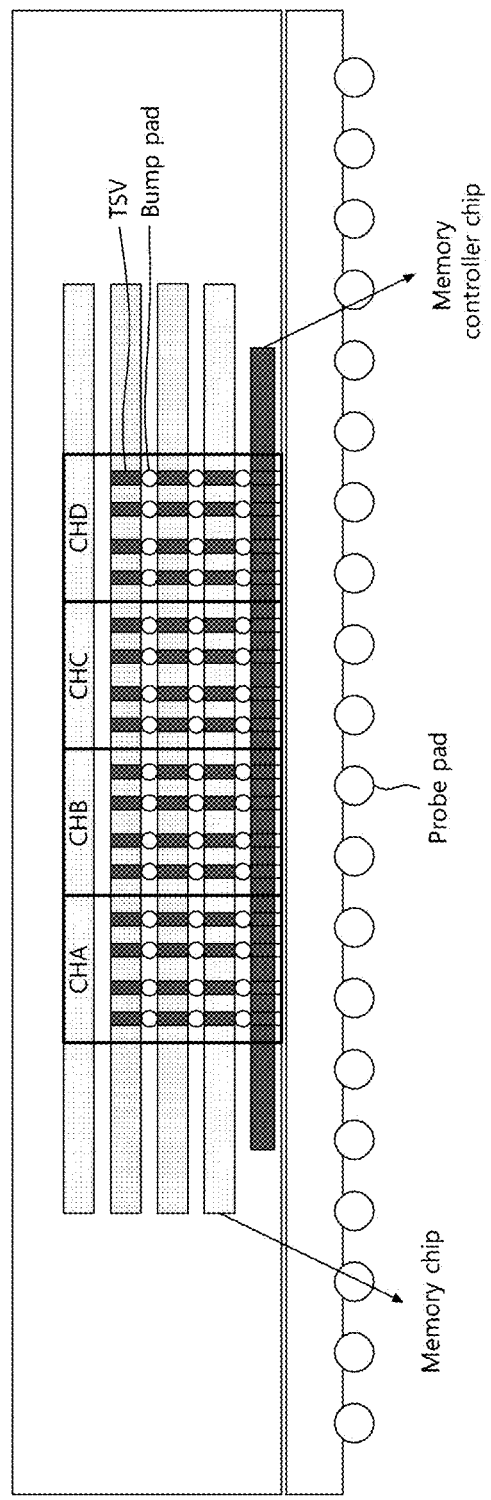
FIG. 1 is a diagram illustrating a representation of an example of a stack type memory system 1 in accordance with an embodiment.

Referring to in FIG. 1, a stack type memory system 1 in accordance with an embodiment may include a plurality of memory chips and a memory controller chip.

The stack type memory system 1 in accordance with an embodiment may be fabricated in the type of a package in which the plurality of memory chips are stacked on the memory controller chip.

A plurality of through vias, that is, TSVs (through-silicon vias), may be formed in each of the plurality of memory chips, and the TSVs of different memory chips may be coupled through bump pads.

The plurality of memory chips may be divided into, for example, first to fourth channels CHA to CHD.

Unlike the bump pads in the package, probe pads may be formed on the outside of the package to be exposed, such that direct probing through external equipment is possible.

Figure 2:
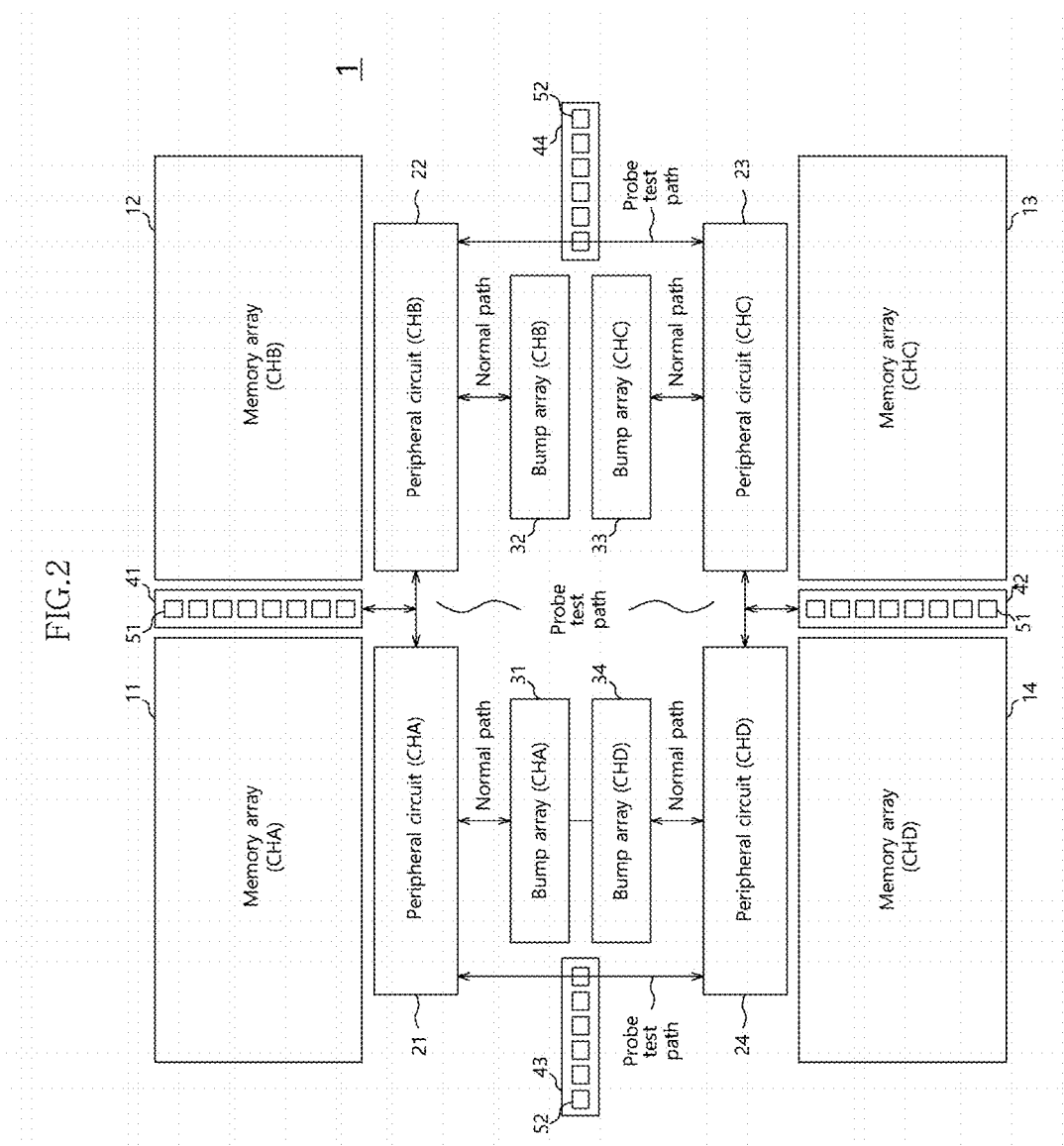
FIG. 2 is a layout diagram illustrating a representation of an example of the stack type memory system 1 in accordance with an embodiment.

Referring to FIG. 2, the stack type memory system 1 may include memory arrays, peripheral circuits, bump arrays and probe pad arrays which correspond to the respective first to fourth channels CHA to CHD.

The stack type memory system 1 may include memory arrays 11 to 14, peripheral circuits 21 to 24, bump arrays 31 to 34 and probe pad arrays 41 to 44 which correspond to the first to fourth channels CHA to CHD.

Each of the bump arrays 31 to 34 may include a plurality of bump pads which are coupled with TSVs.

The probe pad arrays 41 to 44 include probe pads formed to be relatively larger than the bump pads of the bump arrays 31 to 34 which are impossible to test through probes from an exterior, such that a test may be performed through probes from an exterior.

The probe pads of the probe pad arrays 41 and 42 may include pads 51 for input/output of data, and the probe pads of the probe pad arrays 43 and 44 may include pads 52 for input of commands/addresses.

Input/output of data according to a normal operation such as general read/write operations may be implemented through normal paths among the bump arrays 31 to 34, the peripheral circuits 21 to 24 and the memory arrays 11 to 14.

A test operation using probes of an external system, for example, equipment, may be implemented through probe test paths among the probe pad arrays 41 to 44, the peripheral circuits 21 to 24 and the memory arrays 11 to 14.

A memory circuit 100 (i.e., see FIG. 3) in accordance with an embodiment may be included in at least one among the plurality of memory chips illustrated in FIG. 1.

Figure 3:
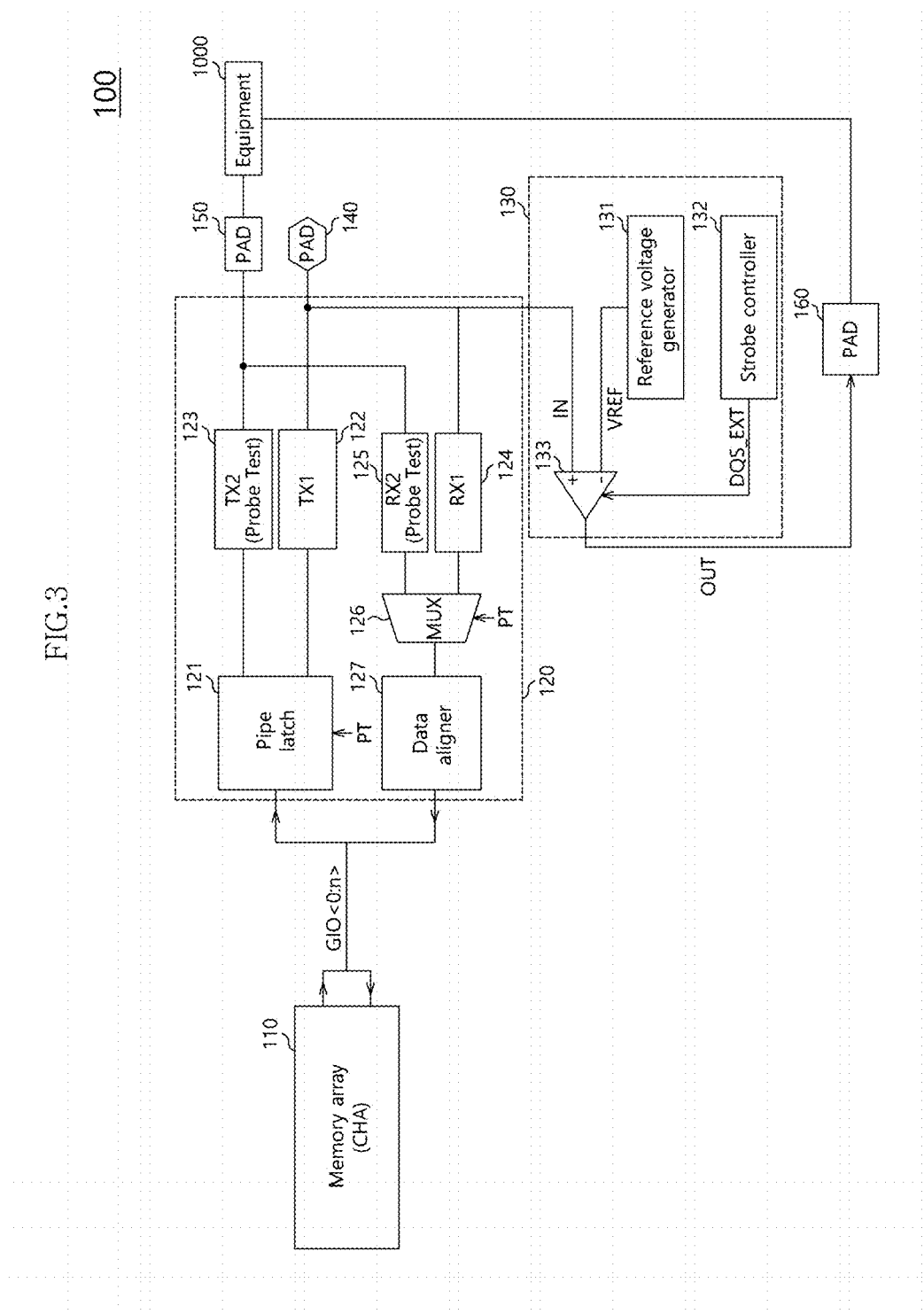
FIG. 3 is a diagram illustrating a representation of an example of the configuration of a memory circuit 100 in accordance with an embodiment.

Referring to FIG. 3, the memory circuit 100 in accordance with an embodiment may include a memory array 110, an input/output path circuit 120, a scanning circuit 130, and pads 140 to 160.

The pad 140 as a bump pad may be used for input/output of data in a normal operation.

The pads 150 and 160 as probe pads may be coupled with equipment 1000.

The probe pad 150 may be used for input/output of data in a test operation, and the probe pad 160 may be one among probe pads used for input/output of data and input/output of commands/addresses.

The memory array 110 may be one among the memory arrays 11 to 14 corresponding to the first to fourth channels CHA to CHD in FIG. 2, for example, the memory array 11 corresponding to the first channel CHA.

The memory array 110 may be coupled with the input/output path circuit 120 through global input/output lines GIO<0:n>.

The input/output path circuit 120 may include a pipe latch 121, a first transmission circuit 122 (i.e., TX1), a second transmission circuit 123 (i.e., TX2), a first reception circuit 124 (i.e., RX1), a second reception circuit 125 (i.e., RX2), a multiplexer 126, and a data aligner 127.

The input/output path circuit 120 may be divided into test input/output paths and normal input/output paths.

The test input/output paths as paths coupled with the probe pad 150 may include a test output path which passes through the pipe latch 121 and the second transmission circuit 123 and a test input path which passes through the second reception circuit 125, the multiplexer 126 and the data aligner 127.

The normal input/output paths as paths coupled with the bump pad 140 may include a normal output path which passes through the pipe latch 121 and the first transmission circuit 122 and a normal input path which passes through the first reception circuit 124, the multiplexer 126 and the data aligner 127.

The pipe latch 121 may transmit data outputted from the memory array 110 according to a read operation, to the first transmission circuit 122 or the second transmission circuit 123 according to a test mode signal PT.

The pipe latch 121 may transmit data outputted from the memory array 110 to the first transmission circuit 122 in a normal operation mode, that is, in the case where the test mode signal PT is a predetermined disabled level.

The pipe latch 121 may transmit data outputted from the memory array 110 to the second transmission circuit 123 in a test mode, that is, in the case where the test mode signal PT is a predetermined enabled level.

The first transmission circuit 122 may transmit data transmitted from the pipe latch 121, to the bump pad 140.

The second transmission circuit 123 may transmit data transmitted from the pipe latch 121, to the probe pad 150.

The first reception circuit 124 may transmit data inputted through the bump pad 140, to the multiplexer 126.

The second reception circuit 125 may transmit data inputted through the probe pad 150, to the multiplexer 126.

The multiplexer 126 may transmit data transmitted through the first reception circuit 124 or the second reception circuit 125, to the data aligner 127 according to the test mode signal PT.

The multiplexer 126 may transmit data transmitted through the first reception circuit 124, to the data aligner 127, in the normal operation mode, that is, in the case where the test mode signal PT is the predetermined disabled level.

The multiplexer 126 may transmit data transmitted through the second reception circuit 125, to the data aligner 127, in the test mode, that is, in the case where the test mode signal PT is the predetermined enabled level.

The data aligner 127 may align data transmitted from the multiplexer 126, and transmit aligned data to the memory array 110. The data aligner 127 may transmit aligned data to the memory array 110 through the global input/output lines GIO<0:n>.

The scanning circuit 130 may include a reference voltage generator 131, a strobe controller 132, and a sensing circuit 133.

The reference voltage generator 131 may change the level of a reference voltage VREF.

The strobe controller 132 may shift the transition timing of a test strobe signal DQS_EXT.

By using a mode register set (MRS) or test mode signals other than the test mode signal PT, the reference voltage generator 131 may change the level of the reference voltage VREF and the strobe controller 132 may shift the transition timing of the test strobe signal DQS_EXT.

The sensing circuit 133 may generate a sensing signal OUT by sensing normal read data, that is, data IN outputted from the input/output path circuit 120 to the bump pad 140, according to the reference voltage VREF and the test strobe signal DQS_EXT.

The sensing signal OUT may be provided to the equipment 1000 through the probe pad 160.

Figure 4:
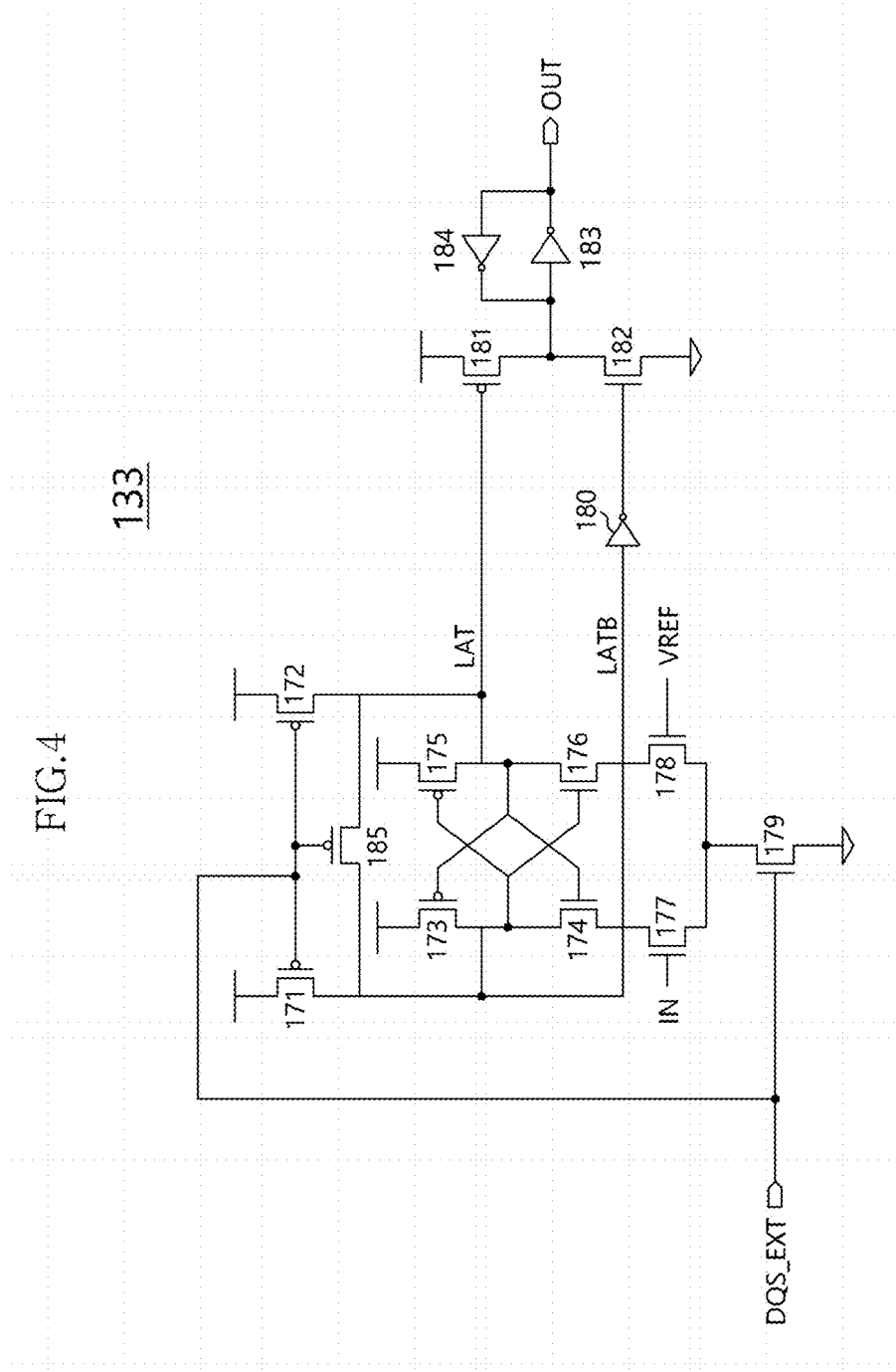
FIG. 4 is a diagram illustrating a representation of an example of the configuration of the sensing circuit 133 illustrated in FIG. 3.

Referring to FIG. 4, the sensing circuit 133 may include a plurality of transistors 171 to 179, 181 and 182, 185, an inverter 180, and a latch including inverters 183 and 184.

The sensing circuit 133 may generate output signals LAT and LATB by comparing the data IN with the reference voltage VREF, and may output the sensing signal OUT by latching a power supply voltage level or a ground voltage level through driving the transistors 181 and 182 according to the output signals LAT and LATB.

Both the output signals LAT and LATB are precharged to a high level during a period in which the test strobe signal DQS_EXT is a low level. Thereafter, as the test strobe signal DQS_EXT transitions to a high level, the reference voltage VREF and the data IN are compared and the levels of the output signals LAT and LATB are changed, and accordingly, the sensing signal OUT may be outputted to a high level or a low level.

Therefore, a test for detecting a level variation of the sensing signal OUT may be performed by a scan operation, that is, an operation of shifting the transition timing of the test strobe signal DQS_EXT or changing the level of the reference voltage VREF.

A method for testing the memory circuit 100 in accordance with an embodiment will be described below with reference to FIGS. 3 to 5.

First, in the state in which the test mode signal PT is enabled, predetermined test data is inputted from the equipment 1000 of FIG. 3 through the probe pad 150.

The test data inputted through the probe pad 150 is written in the memory array 110 through the test input path, that is, through the second reception circuit 125, the multiplexer 126 and the data aligner 127.

Next, if a read command RD is inputted in the state in which the test mode signal PT is disabled, after a predetermined latency (for example, a read latency) is lapsed, the test data written in the memory array 110 is transmitted to the bump pad 140 through the normal output path, that is, through the pipe latch 121 and the first transmission circuit 122, and is also transmitted to the scanning circuit 130.

Then, the equipment 1000 may determine whether the output operation of the memory circuit 100 is a pass or a fail, by using a strobe signal STRB internally generated while iteratively performing the scan operation of controlling at least one of the reference voltage VREF and the test strobe signal DQS_EXT.

For example, it is possible to monitor whether the output operation of the memory circuit 100 is a pass or a fail, through scanning (shifting the transition timing of) the test strobe signal DQS_EXT with the reference voltage VREF set to a predetermined value, and then, it is possible to iteratively monitor whether the output operation of the memory circuit 100 is a pass or a fail, through scanning (shifting the transition timing of) the test strobe signal DQS_EXT with the reference voltage VREF set to another value.

By the above-described scan operation, it is possible to verify AC parameters such as a reference voltage level and a data strobe signal timing capable of outputting valid data.

A memory circuit 101 (i.e., see FIG. 6) in accordance with an embodiment may be included in at least one among the plurality of memory chips illustrated in FIG. 1.

Referring to FIG. 6, the memory circuit 101 in accordance with an embodiment may include an input/output path circuit 200, a scanning circuit 300, pads 400 to 700, and a compensation circuit 800.

While not illustrated in FIG. 6, similarly to FIG. 3, the memory circuit 101 may include a memory array.

The pad 400 as a bump pad may be used for input/output of a data strobe signal DQS in a normal operation.

The pads 500 to 700 are probe pads. The probe pad 500 may be used for input/output of the data strobe signal DQS in a test operation.

The probe pad 600 may be used for being inputted with a test strobe signal DQS_EXT provided from equipment 1000.

The probe pad 700 may be used for transmitting a sensing signal OUT to the equipment 1000.

The input/output path circuit 200 may include a data strobe signal generator 210, a first transmission circuit 220, a second transmission circuit 230, a first reception circuit 240, a second reception circuit 250, and a multiplexer 260.

The input/output path circuit 200 may be divided into test input/output paths and normal input/output paths.

The test input/output paths as paths coupled with the probe pad 500 may include a test output path which passes through the data strobe signal generator 210 and the second transmission circuit 230 and a test input path which passes through the second reception circuit 250 and the multiplexer 260.

The normal input/output paths as paths coupled with the bump pad 400 may include a normal output path which passes through the data strobe signal generator 210 and the first transmission circuit 220 and a normal input path which passes through the first reception circuit 240 and the multiplexer 260.

The data strobe signal generator 210 may generate the data strobe signal DQS according to a read clock signal RD CLK used in a read operation and pattern data DIN.

The first transmission circuit 220 may transmit the data strobe signal DQS generated by the data strobe signal generator 210, to the bump pad 400.

The second transmission circuit 230 may transmit the data strobe signal DQS generated by the data strobe signal generator 210, to the probe pad 500.

The first reception circuit 240 may transmit the data strobe signal DQS inputted through the bump pad 400, to the multiplexer 260.

The second reception circuit 250 may transmit the data strobe signal DQS inputted through the probe pad 500, to the multiplexer 260.

The multiplexer 260 may output the signal transmitted through the first reception circuit 240 or the second reception circuit 250, as a delayed data strobe signal DQS_D, according to a test mode signal PT.

The delayed data strobe signal DQS_D may be provided to a component inside the memory circuit 101, for example, a peripheral circuit.

The scanning circuit 300 may include a sensing circuit 310 and a reference voltage generator 330.

The sensing circuit 310 may generate the sensing signal OUT by sensing, according to a reference voltage VREF and the test strobe signal DQS_EXT, the data strobe signal DQS outputted through the normal output path, that is, from the data strobe signal generator 210 to the bump pad 400, in the normal operation.

The sensing signal OUT may be provided to the equipment 1000 through the probe pad 700.

The sensing circuit 310 may be configured as illustrated in FIG. 4.

The reference voltage generator 330 may change the level of the reference voltage VREF.

By using a mode register set (MRS) or test mode signals other than the test mode signal PT, the reference voltage generator 330 may change the level of the reference voltage VREF.

The compensation circuit 800 may terminate the data strobe signal DQS to a power supply voltage level according to a test mode signal TM.

Figure 7:
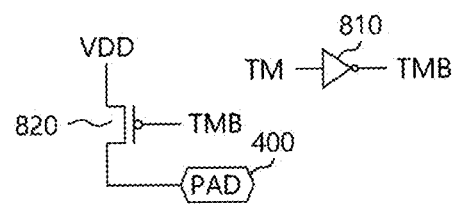
FIG. 7 is a diagram illustrating a representation of an example of the configuration of the compensation circuit 800 illustrated in FIG. 6.

Referring to FIG. 7, the compensation circuit 800 may include an inverter 810 and a transistor 820.

The inverter 810 may invert the test mode signal TM, and generate an inverted test mode signal TMB.

The transistor 820 may terminate the data strobe signal DQS to the level of a power supply voltage VDD according to the inverted test mode signal TMB.

As the transistor 820, a transistor which has smaller driving capability than transistors used in a driver for driving the data strobe signal DQS to a low level or a high level in the data strobe signal generator 210 may be used.

A method for testing the memory circuit 101 in accordance with an embodiment will be described below with reference to FIGS. 6 to 8.

First, if a read command RD is inputted from the equipment 1000 of FIG. 6, after a predetermined latency (for example, a read latency) is lapsed, data is outputted from a memory array, and together with this, transition of the data strobe signal DQS for notifying a data output timing may occur.

Then, the equipment 1000 may perform a test operation of checking various timing parameters associated with the data strobe signal DQS, for example, such as tDQSCK, tRPRE and tRPST, by using the sensing signal OUT while iteratively performing a scan operation of controlling at least one of the reference voltage VREF and the test strobe signal DQS_EXT.

Figure 8:
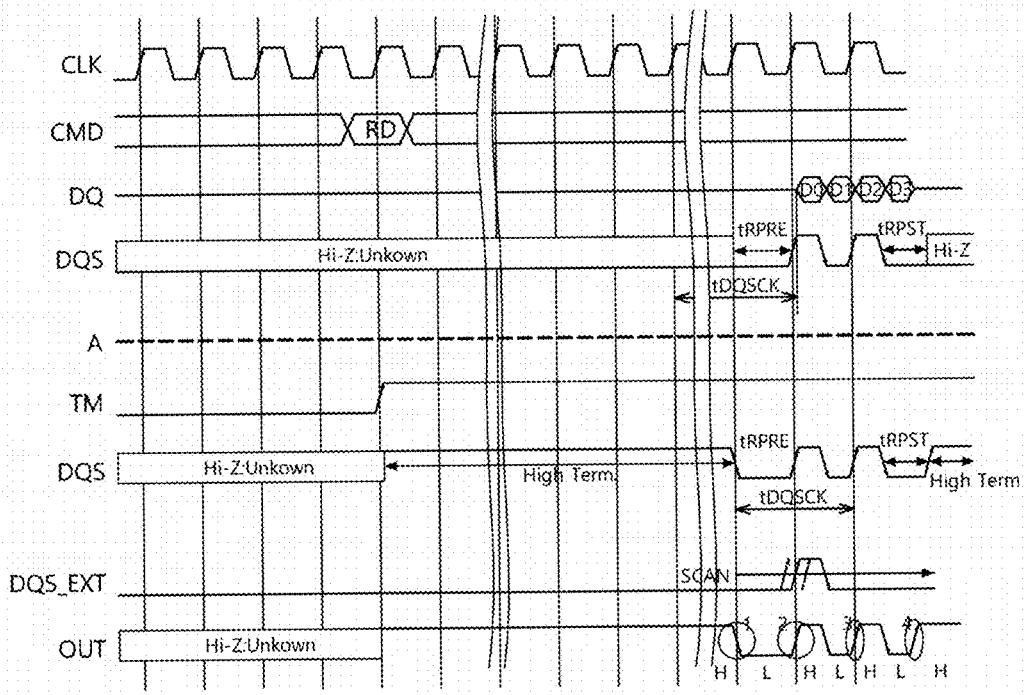
FIG. 8 is a representation of an example of a timing diagram to assist in the explanation of a method for testing the memory circuit in accordance with an embodiment.

Referring to FIG. 8, an upper part above the dotted line 'A' represents the waveform of the data strobe signal DQS in the case where the operation of the compensation circuit 800 is not performed.

During a period remaining by excluding a period in which an actual read operation, that is, data output, is performed, the data strobe signal generator 210 does not operate, and the data strobe signal DQS is in a Hi-Z state in which the level of the data strobe signal DQS is unknown.

Since it is not possible to know a timing at which the data strobe signal DQS transitions to the high level or the low level, it may be difficult to figure out various timing parameters associated with the data strobe signal DQS, for example, such as tDQSCK, tRPRE and tRPST.

Therefore, by enabling the test mode signal TM together with the read command RD, the compensation circuit 820 terminates the data strobe signal DQS to the high level (High Term.).

Then, the data strobe signal DQS transitions to the low level in conformity with a data output period, and transitions again to the high level after the data output period.

As aforementioned above, as the transistor 820 of the compensation circuit 800, a transistor which has smaller driving capability than transistors used in a driver for driving the data strobe signal DQS to the low level or the high level in the data strobe signal generator 210 is used.

Accordingly, the compensation circuit 800 only terminates the data strobe signal DQS to the high level according to the test mode signal TM during the period in which the operation of the data strobe signal generator 210 is interrupted, and does not interfere with the transition of the data strobe signal DQS according to the operation of the data strobe signal generator 210.

The equipment 1000 may perform the test operation of checking the various timing parameters associated with the data strobe signal DQS, for example, such as tDQSCK, tRPRE and tRPST, by using the sensing signal OUT while iteratively performing the scan operation of controlling at least one of the reference voltage VREF and the test strobe signal DQS_EXT.

While various embodiments have been described above, it will be understood to those skilled in the art that the embodiments described are examples only. Accordingly, the memory circuit and the stack type memory system including the same described herein should not be limited based on the described embodiments.

What is claimed is:

1. A memory circuit comprising:
    a memory array;
    an input and output path circuit coupled to a probe pad exposed to an outside and a bump pad, and configured to input and output a signal between an exterior of the memory circuit and the memory array; and
    a scanning circuit configured to be directly coupled to the bump pad and generate a sensing signal by sensing a signal outputted through the bump pad while varying at least one of a reference voltage and a test strobe signal.

2. The memory circuit according to claim 1, wherein the scanning circuit is configured to output the sensing signal to an external equipment through the probe pad.

3. The memory circuit according to claim 1, wherein the input and output path circuit comprises:
    a normal output path passing through a pipe latch which is coupled with the memory array and a first transmission circuit which is coupled between the pipe latch and the bump pad; and
    a normal input path passing through a first reception circuit which is coupled with the bump pad, a multiplexer which is coupled with the first reception circuit, and a data aligner which is coupled between the multiplexer and the memory array.

4. The memory circuit according to claim 3, wherein the input and output path circuit further comprises:
    a test output path passing through the pipe latch which is coupled with the memory array and a second transmission circuit which is coupled between the pipe latch and the probe pad; and
    a test input path passing through a second reception circuit which is coupled with the probe pad, the multiplexer which is coupled with the second reception circuit, and the data aligner.

5. The memory circuit according to claim 1, wherein the scanning circuit comprises:
    a reference voltage generator configured to change a level of the reference voltage;
    a strobe controller configured to shift a transition timing of the test strobe signal; and
    a sensing circuit configured to generate the sensing signal by sensing data outputted from the input and output path circuit to the bump pad, according to the reference voltage and the test strobe signal.

6. The memory circuit according to claim 5, wherein changing of the level of the reference voltage and shifting of the transition timing of the test strobe signal are implemented using a mode register set signal or a test mode signal.

7. The memory circuit according to claim 1, wherein the memory circuit is configured to be inputted with test data through the probe pad from the external equipment and write the test data in the memory array, and provide the test data transmitted to the bump pad from the memory array according to a read command, to the scanning circuit.

8. The memory circuit according to claim 1, wherein the input and output path circuit comprises:
    a normal output path passing through a data strobe signal generator which generates a data strobe signal and a first transmission circuit which is coupled between the data strobe signal generator and the bump pad; and
    a normal input path passing through a first reception circuit which is coupled with the bump pad and a multiplexer which is coupled with the first reception circuit.

9. The memory circuit according to claim 8, wherein the input and output path circuit further comprises:
    a test output path passing through the data strobe signal generator which generates the data strobe signal and a second transmission circuit which is coupled between the data strobe signal generator and the probe pad; and a test input path passing through a second reception circuit which is coupled with the probe pad and the multiplexer which is coupled with the second reception circuit.

10. The memory circuit according to claim 1, wherein the scanning circuit comprises:
   a reference voltage generator configured to change a level of the reference voltage; and
   a sensing circuit configured to generate the sensing signal by sensing a data strobe signal outputted from the input and output path circuit to the bump pad, according to the reference voltage and the test strobe signal.

11. The memory circuit according to claim 10, wherein the test strobe signal is provided from outside the memory circuit.

12. The memory circuit according to claim 10, wherein changing of the level of the reference voltage is implemented using a mode register set signal or a test mode signal.

13. The memory circuit according to claim 1, further comprising:
   a compensation circuit configured to terminate a data strobe signal to a predetermined level according to a test mode signal.

14. A stack type memory system comprising:
   a plurality of memory chips stacked over a memory controller chip,
   wherein through vias are formed in each of the plurality of memory chips, through vias of different memory chips are coupled through bump pads, and the memory system includes probe pads which are exposed to an outside, the probe pads configured for testing, and
   wherein at least one of the plurality of memory chips is configured to generate a sensing signal by sensing a signal transmitted to the bump pad according to a read command while varying at least one of a reference voltage and a test strobe signal.

15. The stack type memory system according to claim 14, wherein at least one of the plurality of memory chips is configured to be inputted with test data through the probe pad from an exterior and write the test data in a memory array, generate the sensing signal by sensing data outputted to the bump pad.

16. The stack type memory system according to claim 14, wherein at least one of the plurality of memory chips is configured to generate the sensing signal by sensing a data strobe signal transmitted to the bump pad.

17. The stack type memory system according to claim 14, wherein at least one of the plurality of memory chips comprises:
   a memory array;
   an input and output path circuit coupled to the probe pad and the bump pad, and configured to input and output a signal between an exterior of the memory chip and the memory array; and
   a scanning circuit configured to be directly coupled to the bump pad and generate the sensing signal by sensing the signal outputted through the bump pad while varying at least one of the reference voltage and the test strobe signal.

18. The stack type memory system according to claim 17, wherein the scanning circuit comprises:
   a reference voltage generator configured to change a level of the reference voltage;
   a strobe controller configured to shift a transition timing of the test strobe signal; and
   a sensing circuit configured to generate the sensing signal by sensing data outputted to the bump pad, according to the reference voltage and the test strobe signal.

19. The stack type memory system according to claim 17, wherein the scanning circuit comprises:
   a reference voltage generator configured to change a level of the reference voltage; and
   a sensing circuit configured to generate the sensing signal by sensing a data strobe signal outputted to the bump pad, according to the reference voltage and the test strobe signal.

20. The stack type memory system according to claim 17, further comprising:
   a compensation circuit configured to terminate a data strobe signal to a predetermined level according to a test mode signal.

21. The memory circuit according to claim 14, wherein the stack type memory system is configured to output the sensing signal to an external equipment through the probe pad.

* * * * *